US007439163B2

(12) United States Patent
Hu et al.
(10) Patent No.: US 7,439,163 B2
(45) Date of Patent: Oct. 21, 2008

(54) METHODS FOR FABRICATING FLUID INJECTION DEVICES

(75) Inventors: Hung-Sheng Hu, Kaohsiung (TW); Wei-Lin Chen, Taipei (TW); Tsung-Ping Hsu, Taoyuan (TW); Der-Rong Shyn, Chiayi County (TW)

(73) Assignees: Qisda Corporation, Taoyuan (TW); Benq Corporation, Taipei (TW)

( * ) Notice: Subject to any disclaimer, the term of this patent is extended or adjusted under 35 U.S.C. 154(b) by 423 days.

(21) Appl. No.: 11/355,982

(22) Filed: Feb. 17, 2006

(65) Prior Publication Data

US 2006/0258138 A1 Nov. 16, 2006

(30) Foreign Application Priority Data

May 12, 2005 (TW) .............................. 94115382 A

(51) Int. Cl.
*H01L 21/20* (2006.01)

(52) U.S. Cl. ............................... 438/478; 257/E21.474

(58) Field of Classification Search ................. 438/497, 438/500, 478; 257/E21.474; 347/65
See application file for complete search history.

(56) References Cited

U.S. PATENT DOCUMENTS 6,102,530 A 8/2000 Kim et al.

*Primary Examiner*—Thao X. Le
*Assistant Examiner*—Elias Ullah
(74) *Attorney, Agent, or Firm*—Muncy, Geissler, Olds & Lowe, PLLC

(57) ABSTRACT

Methods for fabricating fluid injection devices. A patterned sacrificial layer is formed on a substrate. A patterned first structural layer is formed on the substrate covering the sacrificial layer. At least one fluid actuator is formed on the structural layer. A first passivation layer is formed on the first structural covering the at least one fluid actuator. An under bump metal (UBM) layer is conformably formed on the first passivation layer. A patterned first photoresist is formed at a predetermined nozzle site and a contact opening site exposes the UBM layer. A second structural layer is formed on the UBM layer. An etching protective layer is formed on the second structural layer. The first photoresist is removed creating an opening at the nozzle site exposing the UBM layer. The UBM layer in the opening is removed.

21 Claims, 8 Drawing Sheets

METHODS FOR FABRICATING FLUID INJECTION DEVICES

BACKGROUND

The invention relates to methods for fabricating fluid injection devices, and more particularly, to methods for fabricating fluid injection devices comprising a passivation layer with a substantially planar surface.

Typically, fluid injectors are employed in inkjet printers, fuel injectors, biomedical chips and other devices. Among inkjet printers presently known and used, injection by thermally driven bubbles has been most successful due to its reliability, simplicity and relatively low cost.

FIG. 1 is a cross section of a conventional monolithic fluid injector 1 disclosed in U.S. Pat. No. 6,102,530, the entirety of which is hereby incorporated by reference. A structural layer 12 is formed on a silicon substrate 10. A fluid chamber 14 is formed between the silicon substrate 10 and the structural layer 12 to receive fluid 26. A first heater 20 and a second heater 22 are disposed on the structural layer 12. The first heater 20 generates a first bubble 30 in the chamber 14, and the second heater 22 generates a second bubble 32 in the chamber 14 to inject the fluid 26 from the chamber 14.

Conventional monolithic fluid injectors using a bubble as a virtual valve are advantageous due to reliability, high performance, high nozzle density and low heat loss. As inkjet chambers are integrated in a monolithic silicon wafer and arranged in a tight array for high device spatial resolution, no additional nozzle plate is required for assembly.

The structural layer 12 of the conventional monolithic fluid injector 1 comprises low stress silicon nitride. The lifetime of the injector 1 is, however, determined by thickness of the structural layer. Moreover, a droplet may deviate from the desired direction due to structural layer insufficient thickness. Additionally, since heaters 21 and 22 are located on the structural layer, the heat generated by the heaters 22 and 23 may pass through the structural layer into the chamber, causing crosstalk and disturbing the operating frequency.

It is therefore important to provide a fluid injector capable of effectively dissipating heat and having a strengthened structural layer. A metal layer on the structural layer conducts and dissipates residual heat effectively and strengthens the structural layer. The conventional metal layer can be made of gold, platinum, nickel, or nickel based alloy deposited by electrical plating. An under bump metal (UBM) layer is formed before the metal layer is plated. The surface of the metal layer can, however, be roughened after the UBM layer is removed. The rough surface of the metal layer can, however, cause fluid residue causing the trajectory of droplet flight to deviate.

SUMMARY

Methods for fabricating fluid injector devices are provided by employing an etching protective layer to form a structural layer with substantially planar surface, thereby improving injection performance and prolonging lifetime.

The invention provides a method for fabricating a fluid injection device. A substrate is provided. A patterned sacrificial layer is formed on the substrate. A patterned first structural layer is formed on the substrate covering the sacrificial layer. At least one fluid actuator is formed on the structural layer. A first passivation layer is formed on the first structural covering the at least one fluid actuator. An under bump metal (UBM) layer is conformably formed on the first passivation layer. A patterned first photoresist is formed at a predetermined nozzle site and contact opening site exposing the UBM layer. A second structural layer is formed on the UBM layer. An etching protective layer is formed on the second structural layer. The first photoresist is removed creating an opening at the nozzle site exposing the UBM layer. The UBM layer in the opening is removed. A portion of the bottom of the substrate is removed, thereby creating a fluid channel in the substrate and exposing the sacrificial layer. The sacrificial layer is removed to form a fluid chamber. The passivation layer and the first structural layer are sequentially etched to create a nozzle adjacent to the fluid actuator and communicating with the fluid chamber.

The invention provides a method for fabricating a fluid injection device. A patterned sacrificial layer is formed on a substrate. A patterned first structural layer is formed on the substrate covering the sacrificial layer. At least one fluid actuator is formed on the first structural layer. A first passivation layer is formed on the first structural covering the fluid actuator. An under bump metal (UBM) layer is conformably formed on the first passivation layer. A patterned first photoresist is formed at a predetermined nozzle site and contact window site exposing the UBM layer. A second structural layer is formed on the UBM layer. The first photoresist is removed creating an opening at the nozzle site exposing the UBM layer. An etching protective layer is conformably formed on the second structural layer. The UBM layer in the opening is removed. The etching protective layer is removed. A portion of the bottom of the substrate is removed, thereby creating a fluid channel in the substrate and exposing the sacrificial layer. The sacrificial layer is removed to form a fluid chamber. The passivation layer and the first structural layer are sequentially etched to create a nozzle adjacent to the fluid actuator and communicating with the fluid chamber.

DESCRIPTION OF THE DRAWINGS

The invention can be more fully understood by reading the subsequent detailed description in conjunction with the examples and references made to the accompanying drawings, wherein.

DETAILED DESCRIPTION

The invention is directed to methods for fabrication fluid injection devices comprising a passivation layer with substantially planar surface. Reference will now be made in detail to the preferred embodiments of the invention, example of which is illustrated in the accompanying drawings.

First Embodiment

Figure 2A:
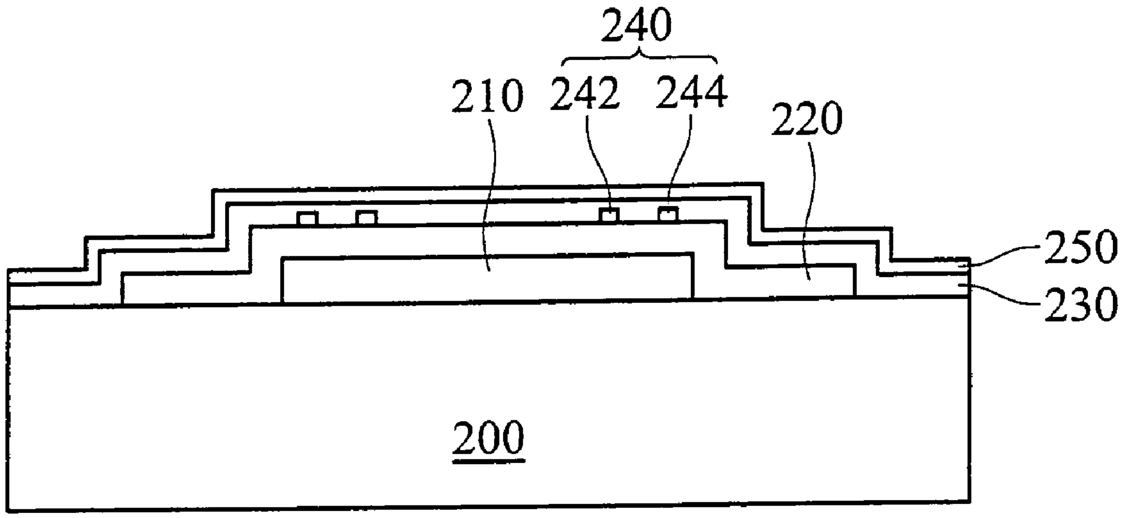
FIGS. 2A-2F are cross-sections of an exemplary method for fabricating a fluid injection device according to the first embodiment of the invention.

FIGS. 2A-2F are cross-sections of an exemplary method for fabricating a fluid injection device according to the first embodiment of the invention. Referring to FIG. 2A, a substrate 200 such as single crystalline silicon wafer is provided. A patterned sacrificial layer 210 is formed on the substrate 200. The sacrificial layer 210 is made of silicon oxide, borophosphosilicate glass (BPSG), or phosphosilicate glass (PSG), for example. The sacrificial layer 210 may be deposited by chemical vapor deposition (CVD) or low pressure chemical vapor deposition (LPCVD). Next, a patterned first structural layer 220 is conformably formed on the substrate 200 covering the sacrificial layer 210. The first structural layer 220 can be made of low stress silicon oxynitride (SiON) or low stress silicon nitride ($Si_3N_4$) deposited by CVD or LPCVD process. The stress of the first structural layer 220 can be approximately 100 to 200 MPa, for example.

At least one fluid actuator 240, such as a bubble generator, is subsequently formed on the first structural layer 220. The bubble generators 240 can be made of a resistive layer, preferably comprising $HfB_2$, TaAl, TaN, or TiN. The bubble generators 240 can be deposited using physical vapor deposition (PVD), such as evaporation, sputtering, or reactive sputtering. Next, a passivation layer 230 is formed on the first structural layer 220 covering the bubble generators 240. The passivation layer 230 can be made of a silicon oxide layer deposited by CVD or LPCVD, for example. Next, an under bump metal (UBM) layer 250 can be formed on the passivation layer 230. The UBM layer 250 can be a thin TiW/Au layer or a thin Cr/Cu layer.

Figure 1:
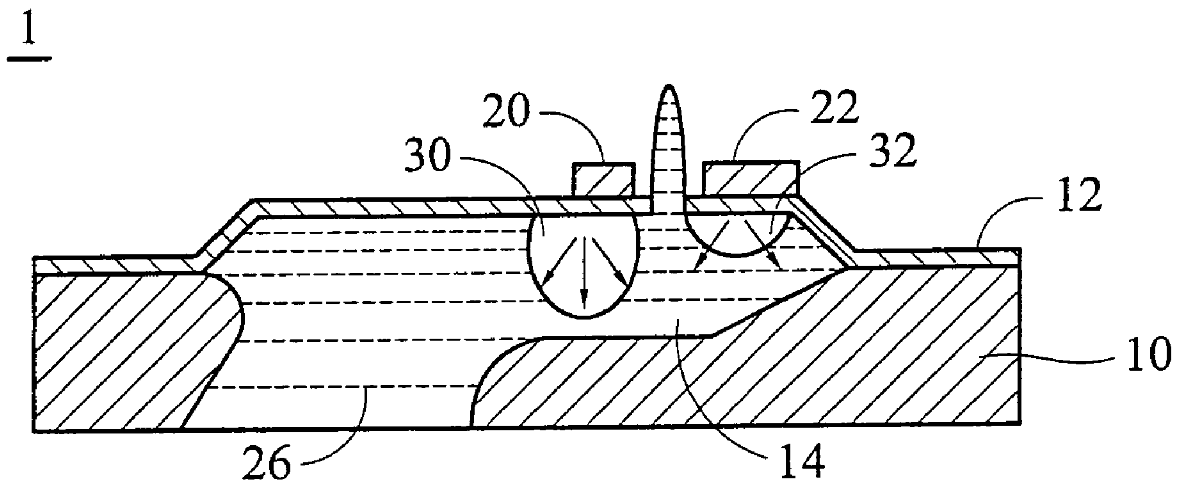
FIG. 1 (RELATED ART)
FIG. 1 is a schematic view of a conventional fluid injection device.

According to the invention, the bubble generators 240 may also comprise a first heater 242 and a second heater 244, for example. The first heater 242 generates a first bubble (as shown in FIG. 1) in the chamber, and the second heater 244 generates a second bubble (as shown in FIG. 1) in the chamber to inject the fluid from the chamber.

An embodiment of a method for fabricating the fluid injection device may further comprise forming a signal transmitting circuit (not shown) disposed between the first structural layer 220 and passivation layer 230 connecting the bubble generators 240. The signal transmitting circuit can be made of conductive layer, such as aluminum (Al), copper (Cu), Al—Cu alloy, or other conductive materials deposited by PVD, for example.

Figure 2B:
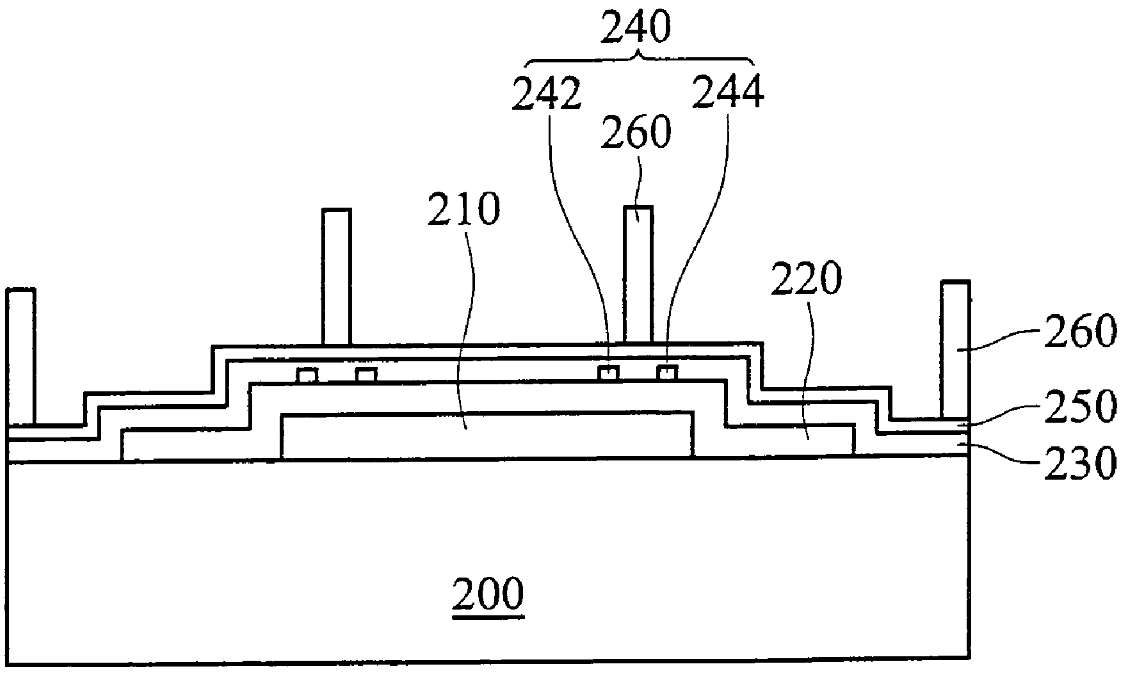

Referring to FIG. 2B, a patterned first photoresist 260 is lithographically formed at a predetermined nozzle site and exposing the UBM layer 250.

Figure 2C:
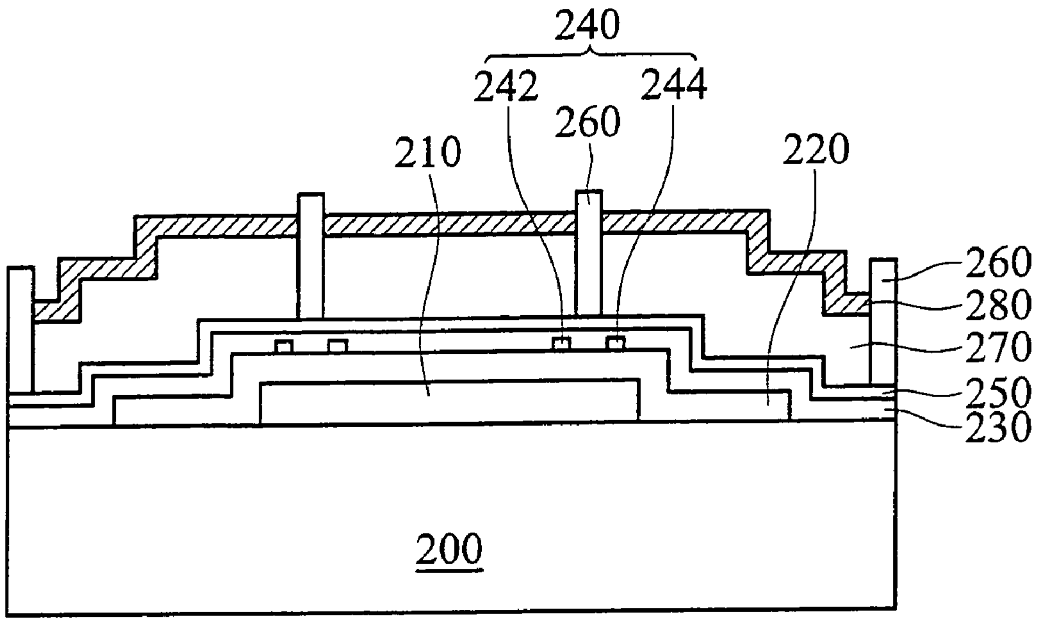

Referring to FIG. 2C, a second structural layer 270 is formed on the UBM layer 250. The second structural layer 270 is made of metal comprising Au or Au-based alloy deposited by electroplating, electro-forming, electroless plating, physical vapor deposition or chemical vapor deposition, for example. Next, an etching protective layer 280 is formed on the second structural layer 270. The etching protective layer 280 can protect the second structural layer 270 during etching the UBM layer 250, thus maintaining a smooth surface preventing from fluid residue on the nozzle. The droplet flying trajectory deviation can also be prevented, thereby improving injection quality.

The etching protective layer 280 can be made of a metal layer comprising Ni, Cr, Cu, or alloys thereof deposited by electroplating, electro-forming, electroless plating, physical vapor deposition or chemical vapor deposition, for example. Alternatively, the etching protective layer 280 can also be made of photoresist. The photoresist is different from the first photoresist layer with different etching selectivity, i.e., it requires a different etching solution to remove.

Figure 2D:
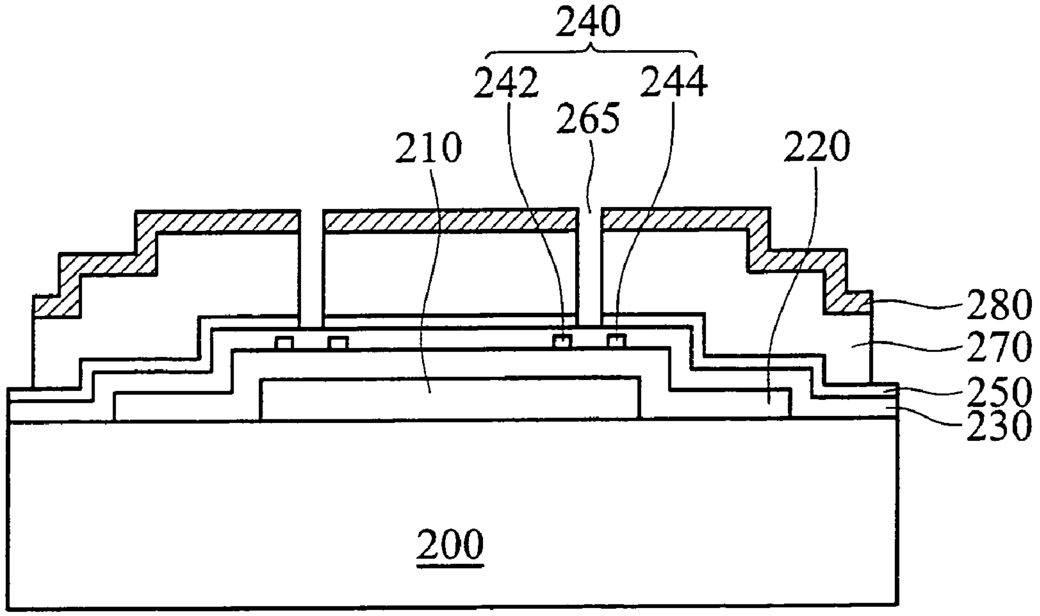

Referring to FIG. 2D, the first patterned photoresist 260 is subsequently removed, exposing the surface of the UBM layer 250 in the opening 265.

Figure 2E:
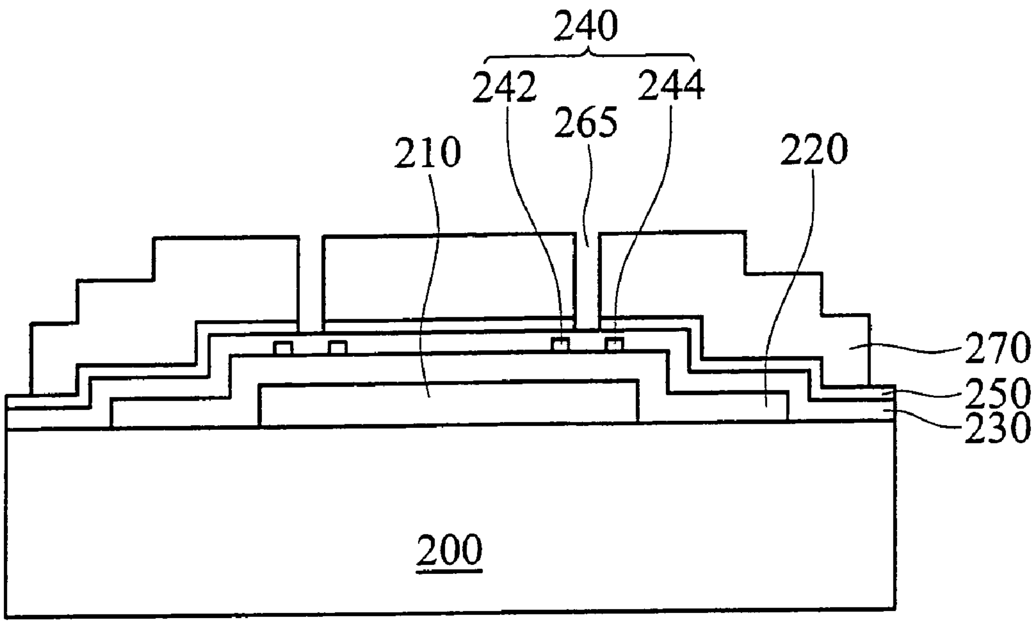

Referring to FIG. 2E, the exposed UBM layer 250 in the opening 265 is subsequently removed by wet etching or dry etching, for example. Wet etching may comprise removing the UBM layer 250 using KI solution. The dry etching may comprise removing the UBM layer 250 using reactive ion etching (RIE). With the etching protective layer 280, the second structural layer 270 can maintain a substantially planar surface. Next, the etching protective layer 280 is removed.

Figure 2F:
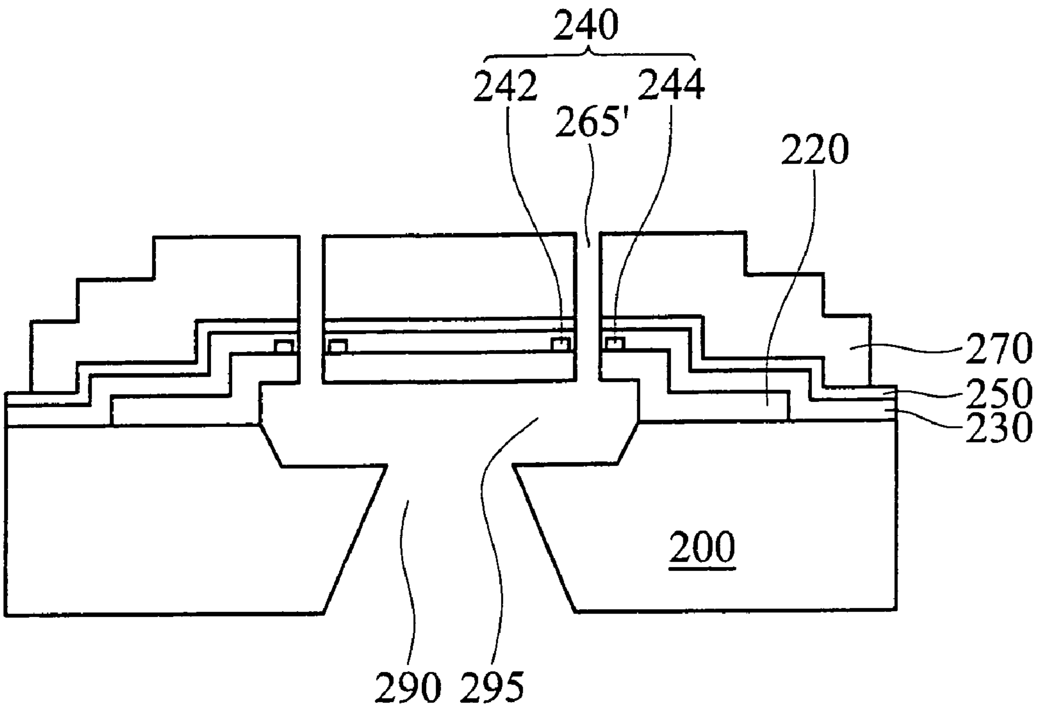

Referring to FIG. 2F, the back of the substrate 200 is etched forming a fluid channel 290 in the substrate 200 and exposing the sacrificial layer 210. The sacrificial layer 210 is subsequently removed and enlarged, forming a fluid chamber 295.

Next, a nozzle 265 is formed by etching the passivation layer 230 and the first structural layer 220 along the opening 265. The nozzle 265 is adjacent to the bubble generators 240 communicating with the fluid chamber 295.

Second Embodiment

Figure 3A:
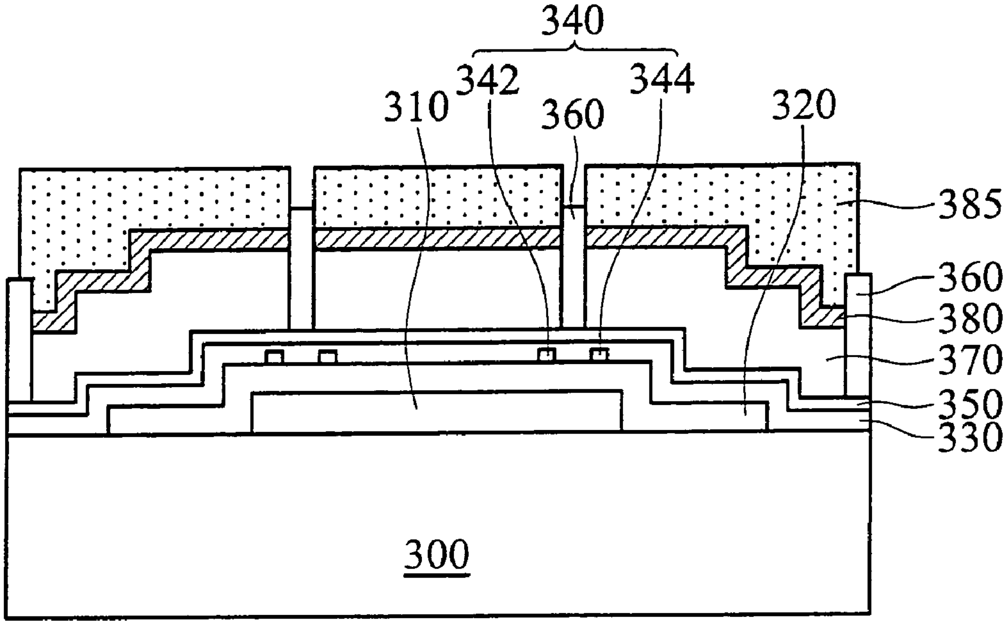
FIGS. 3A to 3D are cross-sections of an exemplary method for fabricating a fluid injection device according to the second embodiment of the invention.

FIGS. 3A to 3D are cross-sections of an exemplary method for fabricating a fluid injection device according to the second embodiment of the invention. Referring to FIG. 3A, a base structure of FIG. 2C is provided. The method for fabricating the base structure of FIG. 2C in the second embodiment is nearly identical to the method of the first embodiment and for simplicity its detailed description is omitted.

A second photoresist 385 is formed on an etching protective layer 380 exposing the first photoresist 360. The second photoresist 385 is different from the first photoresist layer 360 with different etching selectivity, i.e., it requires a different etching solution to remove.

Figure 3B:
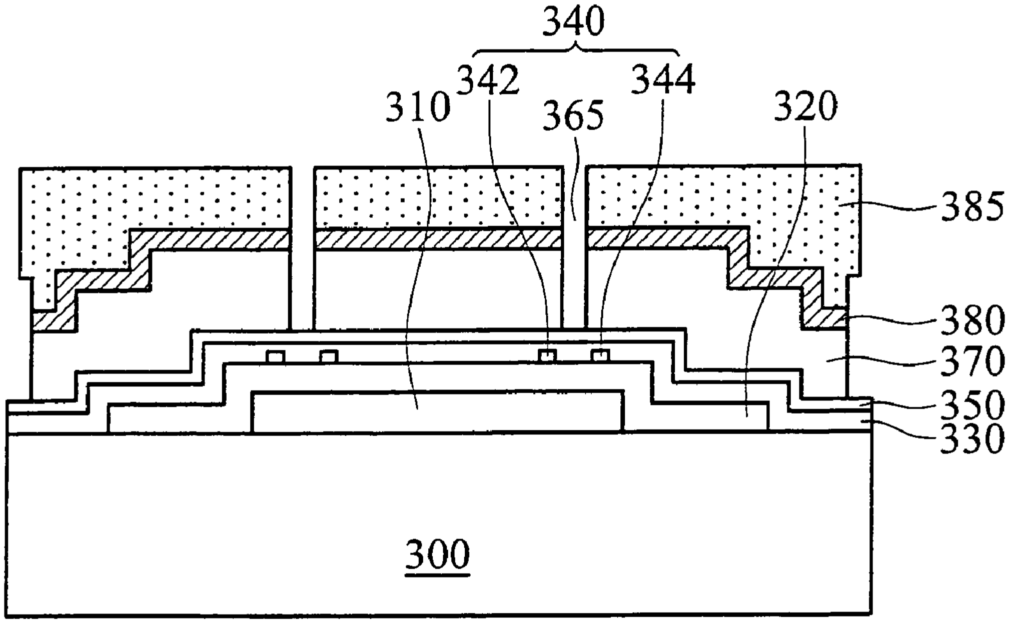
Figure 3C:
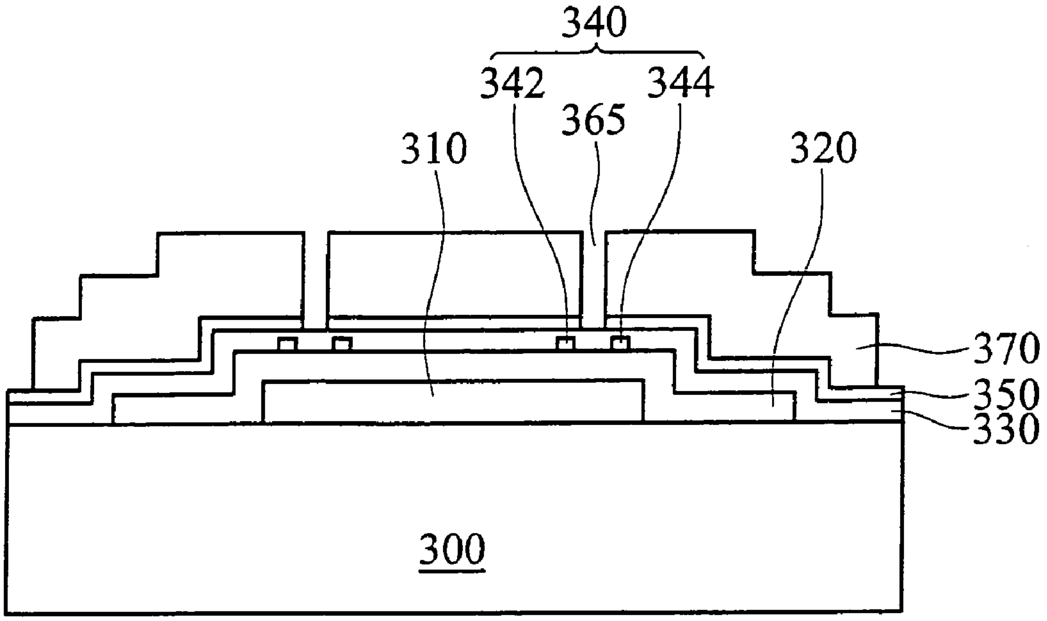

Referring to FIG. 3B, the first patterned photoresist 360 is subsequently removed, exposing the surface of the UBM layer 350 in the opening 365. Next, the exposed UBM layer 350 in the opening 365 is subsequently removed by wet etching or dry etching, for example. Wet etching may comprise removing the UBM layer 350 using KI solution. The dry etching may comprise removing the UBM layer 350 using reactive ion etching (RIE). With the second photoresist 385 and the etching protective layer 380, the second structural layer 370 can maintain a substantially planar surface. Next, the second photoresist 385 and the etching protective layer 380 are sequentially removed, as shown in FIG. 3C.

Figure 3D:
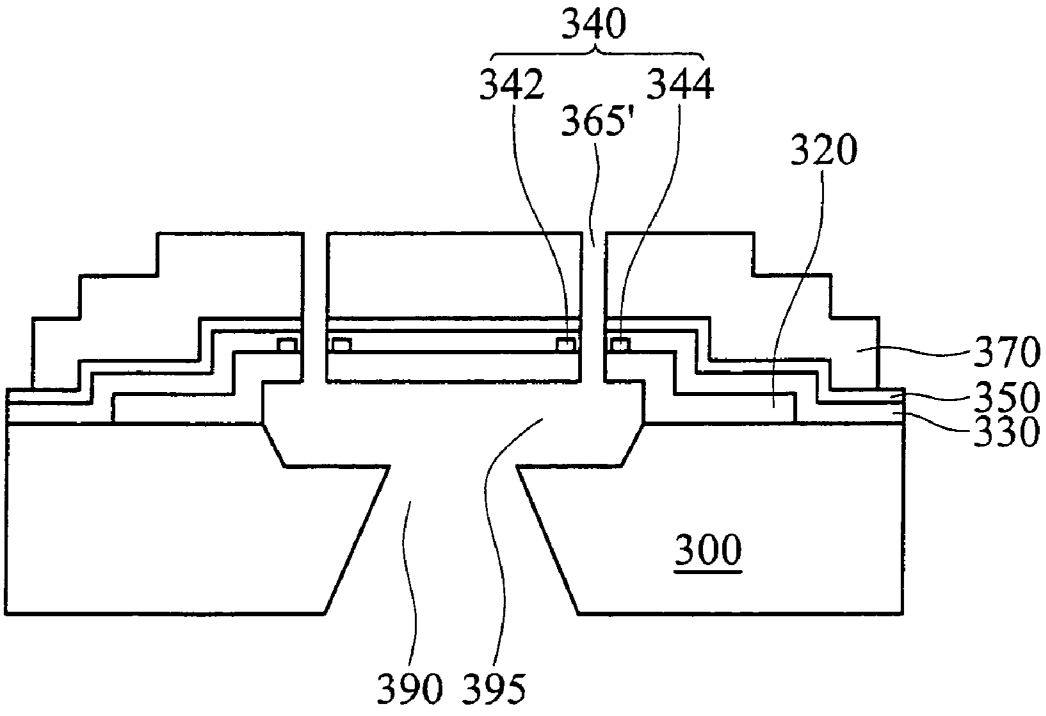

Referring to FIG. 3D, the back of the substrate 300 is etched to form a fluid channel 390 in the substrate 300 and exposes the sacrificial layer 310. The sacrificial layer 310 is subsequently removed and enlarged, forming a fluid chamber 395.

Next, a nozzle 365 is formed by etching the passivation layer 330 and the first structural layer 320 along the opening 365. The nozzle 365 is adjacent to the bubble generators 340 communicating with the fluid chamber 395.

Third Embodiment

Figure 4A:
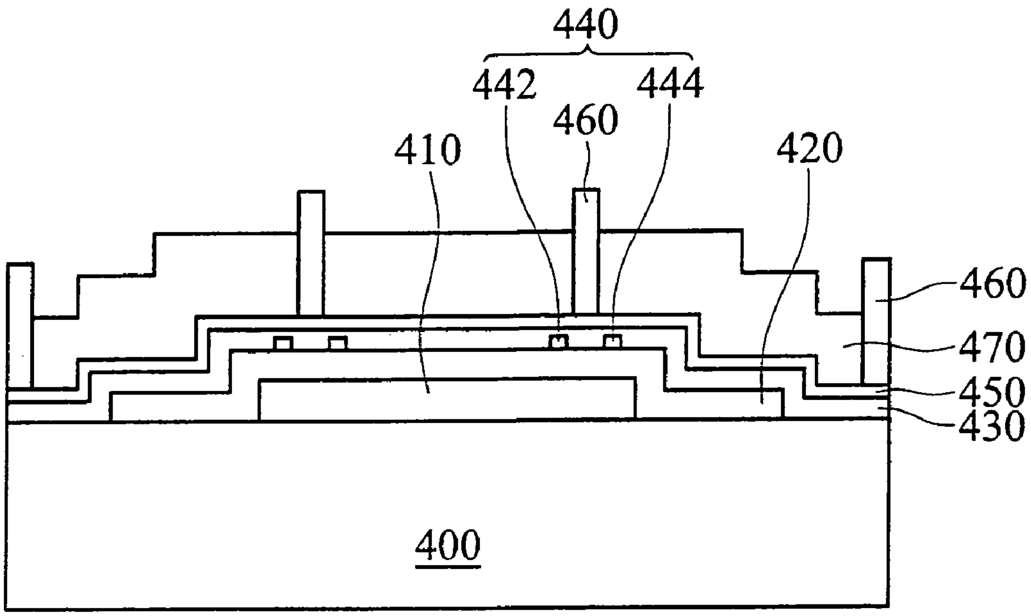
FIGS. 4A to 4D are cross-sections of an exemplary method for fabricating a fluid injection device according to the third embodiment of the invention.

FIGS. 4A to 4D are cross-sections of an exemplary method for fabricating a fluid injection device according to the third embodiment of the invention. Referring to FIG. 4A, a base structure of FIG. 2C is provided. The method for fabricating the base structure of FIG. 2C in the third embodiment is nearly identical to the method of the first embodiment and for simplicity its detailed description is omitted.

Figure 4B:
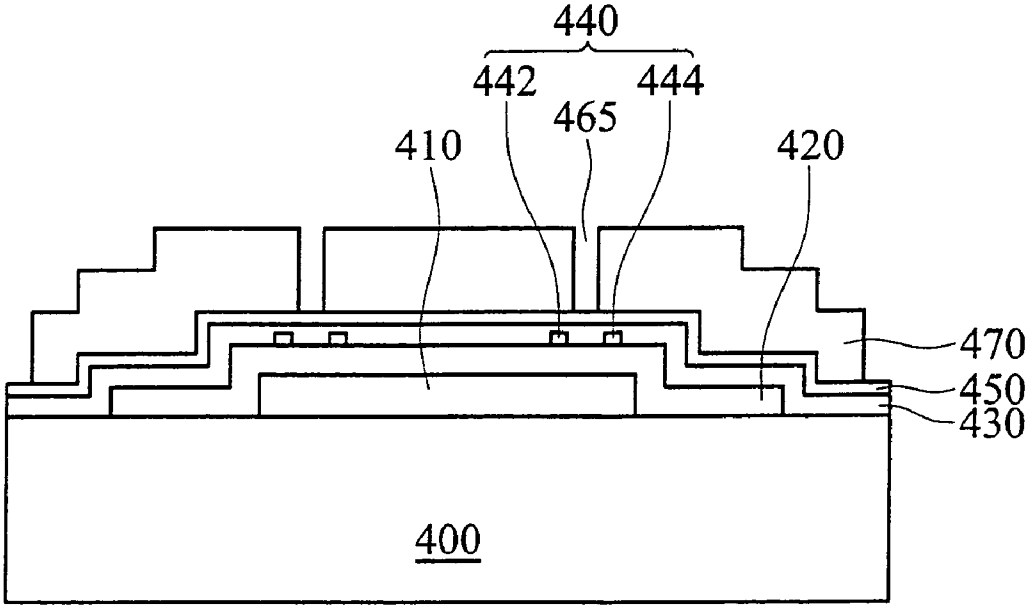

Referring to FIG. 4B, the first patterned photoresist 460 is subsequently removed, exposing the surface of the UBM layer 450 in the opening 465.

Figure 4C:
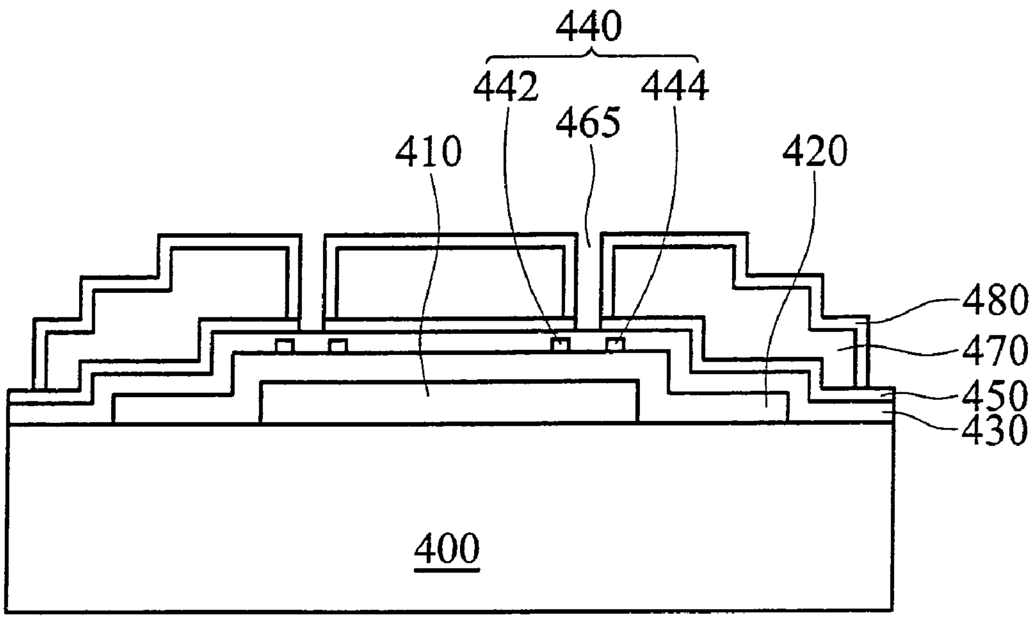

Referring to FIG. 4C, an etching protecting layer 480 is conformably formed on the second structural layer 470. Next, the exposed UBM layer 450 in the opening 465 is subsequently removed by wet etching or dry etching, for example. Wet etching may comprise removing the UBM layer 450 using KI solution. The dry etching may comprise removing the UBM layer 450 using reactive ion etching (RIE). With the etching protective layer 480, the second structural layer 470 can maintain a substantially planar surface.

Figure 4D:
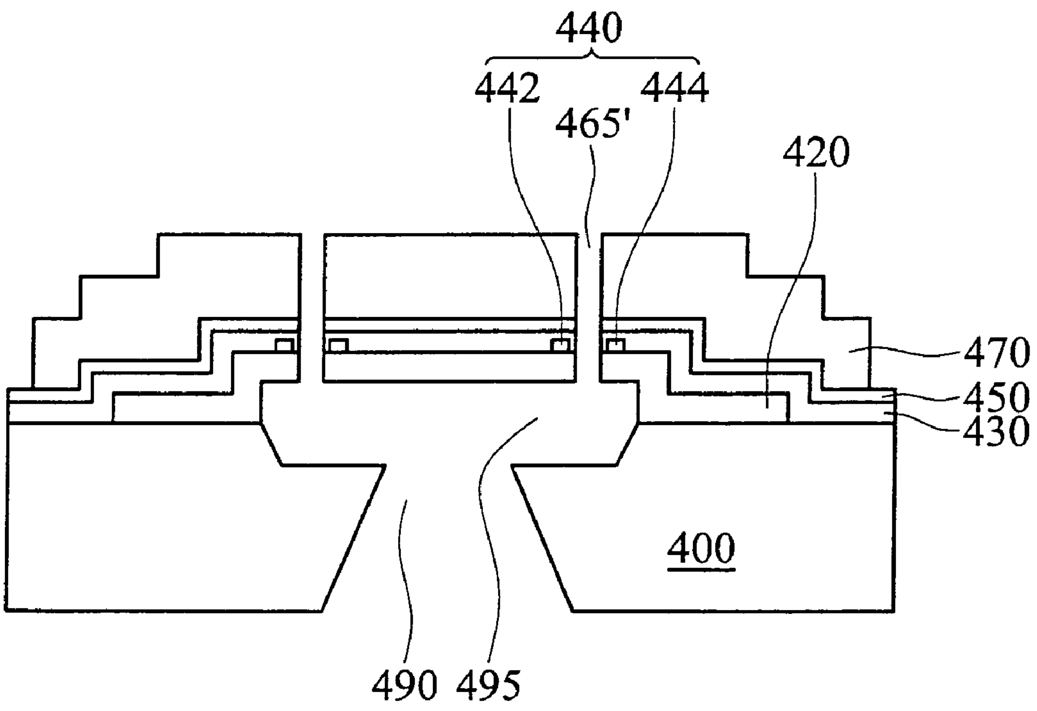

Referring to FIG. 4D, the etching protective layer 480 is removed. Next, the back of the substrate 400 is etched forming a fluid channel 490 in the substrate 400 and exposing the sacrificial layer 410. The sacrificial layer 410 is subsequently removed and enlarged, forming a fluid chamber 495.

Next, a nozzle 465' is formed by etching the passivation layer 430 and the first structural layer 420 along the opening 465. The nozzle 465' is adjacent to the bubble generators 440 communicating with the fluid chamber 495.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a fluid injection device, comprising:

providing a substrate;

forming a patterned sacrificial layer on the substrate;

forming a patterned first structural layer on the substrate covering the sacrificial layer;

forming at least one fluid actuator on the structural layer;

forming a first passivation layer on the first structural covering the at least one fluid actuator;

conformably forming an under bump metal (UBM) layer on the first passivation layer;

forming a patterned first photoresist at a predetermined nozzle site and contact opening site exposing the UBM layer;

forming a second structural layer on the UBM layer;

forming an etching protective layer on the second structural layer;

removing the first photoresist creating an opening at the nozzle site expositing the UBM layer;

removing the UBM layer in the opening;

removing a portion of the bottom of the substrate, thereby creating a fluid channel in the substrate and exposing the sacrificial layer;

removing the sacrificial layer to form a fluid chamber; and sequentially etching the passivation layer and the first structural layer to create a nozzle adjacent to the fluid actuator and communicating with the fluid chamber.

2. The method as claimed in claim 1, wherein the first structural layer comprises a low stress silicon nitride layer or a low stress silicon oxynitride layer.

3. The method as claimed in claim 2, wherein the first passivation layer comprises a silicon oxide layer.

4. The method as claimed in claim 1, wherein the UBM layer is made of a composite layer comprising TiW and W.

5. The method as claimed in claim 1, wherein the second structural layer comprises a substantially planar surface.

6. The method as claimed in claim 1, wherein the second structural layer comprises Au, or alloys thereof.

7. The method as claimed in claim 1, wherein the second structural layer is formed by electroplating, electroforming, or electroless plating.

8. The method as claimed in claim 1, wherein the etching passivation layer comprises Ni, Cr, Cu, or alloys thereof.

9. The method as claimed in claim 1, wherein the etching passivation layer comprises photosesist.

10. The method as claimed in claim 1, wherein the etching passivation layer is formed by electroplating, electroforming, or electroless plating.

11. The method as claimed in claim 1, wherein the UBM layer is removed by KI solution.

12. The method as claimed in claim 1, further comprising forming a second photoresist layer covering the etching passivation layer exposed by the first photoresist layer; and removing the second photoresist after the UBM layer is removed.

13. A method for fabricating a fluid injection device, comprising:

forming a patterned sacrificial layer on a substrate;

forming a patterned first structural layer on the substrate covering the sacrificial layer;

forming at least one fluid actuator on the first structural layer;

forming a first passivation layer on the first structural covering the fluid actuator;

conformably forming an under bump metal (UBM) layer on the first passivation layer;

forming a patterned first photoresist at a predetermined nozzle site and contact window site exposing the UBM layer;

forming a second structural layer on the UBM layer;

removing the first photoresist creating an opening at the nozzle site exposing the UBM layer;

conformably forming an etching protective layer on the second structural layer;

removing the UBM later in the opening;

removing the etching protective layer;

removing a portion of the bottom of the substrate, thereby creating a fluid channel in the substrate and exposing the sacrificial layer;

removing the sacrificial layer to form a fluid chamber; and sequentially etching the passivation layer and the first structural layer to create a nozzle adjacent to the fluid actuator and communicating with the fluid chamber.

14. The method as claimed in claim 13, wherein the first structural layer comprises a low stress silicon nitride layer or a low stress silicon oxynitride layer.

15. The method as claimed in claim 13, wherein the first passivation layer comprises a silicon oxide layer.

16. The method as claimed in claim 13, wherein the UBM layer is made of a composite layer comprising TiW and W.

17. The method as claimed in claim 13, wherein the second structural layer comprises Au, or alloys thereof.

18. The method as claimed in claim 13, wherein the second structural layer is formed by electroplating, electroforming, or electroless plating.

19. The method as claimed in claim 13, wherein the etching passivation layer comprises Ni, Cr, Cu, or alloys thereof.

20. The method as claimed in claim 13, wherein the etching passivation layer is formed by electroplating, electroforming, or electroless plating.

21. The method as claimed in claim 13, wherein the UBM layer is removed by KI solution.

* * * * *